United States Patent
Yamagata

[19]
[11] Patent Number: 5,853,365
[45] Date of Patent: Dec. 29, 1998

[54] MAGNETIC RESONANCE IMAGING USING PULSE SEQUENCE INCLUDING TRAPEZOIDAL-WAVE GRADIENT

[75] Inventor: Hitoshi Yamagata, Otawara, Japan

[73] Assignee: Kabushiki Kaisha Toshiba, Kawasaki, Japan

[21] Appl. No.: 828,269

[22] Filed: Mar. 21, 1997

[30] Foreign Application Priority Data

Mar. 21, 1996 [JP] Japan .................................. 8-064857

[51] Int. Cl.⁶ .................................................. A61B 5/055
[52] U.S. Cl. ........................ 600/410; 600/419; 324/306; 324/309
[58] Field of Search ................... 600/410, 419; 324/306, 307, 309

[56] References Cited

U.S. PATENT DOCUMENTS

| | | | |
|---|---|---|---|
| 5,042,485 | 8/1991 | Sano et al. | 600/419 |
| 5,436,562 | 7/1995 | Dumoulin | 600/419 |

OTHER PUBLICATIONS

J. L. Duerk, et al., "Analysis of Imaging Axes Significance in Motion Artifact Suppression Technique (MAST): MRI of Turbulent Flow and Motion", Magn. Reson. Imag., vol. 7, pp. 251–263, 1989.

P. M. Pattany, et al., "Motion Artifact Suppression Technique (MAST) for MR Imaging", J. of Comput. Assist. Tomogr., vol. 11, (3), pp. 369–377, 1987.

H. Yamagata, "Optimized Gradient Pulses for MR Quantitative Flow Imaging and Angiography", RSNA, vol. 173 (P), p. 162, 1989.

Primary Examiner—Ruth S. Smith
Attorney, Agent, or Firm—Oblon, Spivak, McClelland, Maier & Neustadt, P.C.

[57] ABSTRACT

A method to null a phase relevant to a high-order moment and minimize an echo time TE when a GMN or flow-encoding gradient pulse is employed. The first to n-th trapezoidal-wave pulses of which polarities are alternately mutually opposite are applied as a gradient pulse. The amplitude g and pulse duration t of the first trapezoidal-wave pulse, and the slope k of pulses of the first trapezoidal-wave pulse are given as initial values. Parameters including a plurality of known pulse duration coefficients $b_1$, $b_2$, etc. determining pulse durations $b_1.t$, $b_2.t$, etc. of the first to n-th trapezoidal-wave pulses, and unknown magnetic field gradient strength coefficients $a_1$, $a_2$, etc. determining amplitudes $a_1.g$, $a_2.g$, etc. of the second and subsequent trapezoidal-wave pulses are given. Expressions concerning phases of nuclear spins producing an MR signal are solved analytically so that the values of terms of phases relevant to moments in the expressions can be controlled to be desired values or nulled according to the purpose of use of the gradient pulse. A combination of the coefficients $b_1$, $b_2$, etc. satisfying the results of the analysis, in which the coefficient $b_3$ for a pulse interval defining the pulse spacing of the n-th trapezoidal-wave pulse has the smallest value, is selected.

20 Claims, 9 Drawing Sheets

PARAMETERS FOR USE IN DESIGNING QUADRUPLE GRADIENT PULSE

FLOW-ENCODING PULSE APPLIED
IN SLICING DIRECTION

FIG. 2

FLOW-ENCODING PULSE APPLIED
IN READOUT DIRECTION

FIG. 3

PARAMETERS FOR USE IN DESIGNING QUADRUPLE GRADIENT PULSE

BASIC FUNCTION

MAGNETIC RESONANCE IMAGING USING PULSE SEQUENCE INCLUDING TRAPEZOIDAL-WAVE GRADIENT

BACKGROUND OF THE INVENTION

1. Field of the Invention

The present invention relates to magnetic field imaging (MRI) utilizing a magnetic resonance (MR) phenomenon caused by nuclear spins in a patient. More particularly, this invention is concerned with a magnetic resonance imaging method and system for carrying out gradient moment nulling (GMN) and flow encoding by using a pulse sequence including trapezoidal-wave gradients.

2. Description of the Related Art

In magnetic resonance imaging employed in the field of medicine in recent years, a pulse sequence according to which a gradient pulse is applied in each of a slicing direction, phase-encoding direction, and readout direction which are defined in a three-dimensional space is often adopted in order to append position information concerning a location in the three-dimensional space in which a patient is placed to an MR signal.

If an area of a patient to be imaged contains a moving substance such as a blood flow, since nuclear spins move in a magnetic field gradient, an effect of motion is exerted. The effect of motion becomes one of the factors causing artifacts in a normal MRI image. In compliance with a demand for an MRI image little affected by artifacts, a gradient pulse should preferably be a pulse enabling gradient moment nulling (GMN) (refer to, for example, "Motion Artifact Suppression Technique (MAST) for MR Imaging" by Pradip M. Pattany et al. (Journal of Computer Assisted Tomography, 11 (3), p.369–377, May and June of 1987).

A gradient pulse enabling GMN is intended to control the 0th-order (location) moment of nuclear spins and compensate phases relevant to the first and subsequent moments thereof.

By the way, flow imaging for a blood flow or the like, which is one approach to magnetic resonance imaging (MRI), attempts to make the most of the effect of motion. The flow imaging approach to MRI is broadly divided into two techniques; a technique handling the amplitude of a longitudinal magnetization (amplitude technique, or time-of-flight technique), and a technique handling the phase of a transverse magnetization (phase technique). Both techniques have merits and demerits. In particular, the phase technique is suitable for contrast-imaging of fine vessels whose inner diameters are equal to or smaller than 1 mm, such as intracranial vessels.

The phase technique utilizes such a phenomenon that a difference between a phase shift in stationary spins and a phase shift in motional spins becomes significant in a magnetic field gradient. The difference between phase shifts is generally proportional to the moment (for example velocity) of motional spins, and is therefore quantitative. The phase technique is fundamentally not concerned with amplitude information. For improving the precision in calculating a phase, it is indispensable to improve a signal-to-noise ratio of a signal. An echo time TE must therefore be made as short as possible in order to improve the signal-to-noise ratio.

For implementing the phase method, a flow-encoding pulse that is one form of a gradient pulse in terms of usage is used. The flow-encoding pulse is intended to control only a phase relevant to a specific moment (for example, velocity) of nuclear spins, and compensates (nulls shifts of) phases relevant to the other moments. The phase technique thus attempts to achieve blood flow imaging.

When blood flows through a region whose sectional area varies, such as a region with vascular stenosis or vascular bifurcation, the direction or velocity of the flow in the region varies complexly. Not only a phase relevant to the velocity, that is, the first moment of nuclear spins but also phases relevant to (acceleration and others) higher-order moments thereof are added to a phase shift to be observed. For implementing gradient moment nulling (GMN) precisely or measuring a blood flow velocity precisely, it is necessary to compensate phases relevant to the higher-order moments. For this purpose, it is required to use a gradient pulse composed of a larger number of pulses. When a gradient pulse composed of a larger number of pulses is used, that the number of polarity reverses of a GMN pulse or flow-encoding pulse increases, the overall pulse duration extends temporally, eventually an echo time TE gets longer, and the amplitude of an MR signal decreases, There is therefore a limitation in improvement of a signal-to-noise ratio. In other words, there is a limitation in improvement of precision in calculating a phase. Thus, image quality or precision in measuring a flow velocity has not been improved very much, and reliability has been unsatisfactory.

SUMMARY OF THE INVENTION

An object of the present invention is to provide a magnetic resonance imaging method, which makes it possible to compensate phase terms in high-order moments of nuclear spins and to shorten an echo time TE when a GMN gradient pulse or flow-encoding gradient pulse is used.

For accomplishing the above object, as one aspect of the invention, there is provided a method of magnetic resonance (MR) imaging by which an object is imaged using a pulse sequence including a gradient pulse, comprising the steps of: preparing the pulse sequence in advance; and performing a scan of the object using the pulse sequence, wherein the preparing steps further comprising the steps of: providing, as said gradient pulse, three or more trapezoidal-wave pulses of which polarities are time-sequentially inverted, an amplitude g, a pulse duration t, and a slope k or a rise time rate of its polarity-inverting side pulse in connection with the first trapezoidal-wave pulse being given as initial values, a plurality of pulse duration coefficients $b_1$, $b_2$, etc. which determine pulse spacings $b_1 \cdot t$, $b_2 \cdot t$, etc. of the plurality of trapezoidal-wave pulses being known, and magnetic field gradient strength coefficients $a_1$, $a_2$, etc. which determine amplitude $a_1 \cdot g$, $a_2 \cdot g$, etc. of the second and subsequent trapezoidal-wave pulses being unknown; analytically solving expressions concerning phase terms $\emptyset(t)$ of nuclear spins producing an MR signal $S(t)$ so that the values of at least a phase term $\emptyset_0(t)$ of stationary nuclear spins, a phase term $\emptyset_1(t)$ of nuclear spins having a velocity moment, and a phase term $\emptyset_2(t)$ of nuclear spins having an acceleration moment among the phase terms $\emptyset(t)$ are controlled to be desired values or are null according to the purpose of use of said gradient pulse, and selecting one of combinations of said plurality of pulse duration coefficients $b_1$, $b_2$, etc. satisfying the results of the analysis, in which said coefficient for a pulse interval defining the pulse spacing of the last trapezoidal-wave pulse has the smallest value.

Preferably, the gradient pulse is a flow encoding pulse nulling phase terms other than the phase term $\emptyset_1(t)$ of nuclear spins having the velocity moment.

In this case, it is preferred that the flow encoding pulse is a third-order flow encoding pulse having the three trapezoidal-wave pulses, and said pulse duration coefficient for the pulse interval defining the pulse spacing of the last trapezoidal-wave is the pulse duration coefficient $b_2$ as for the third trapezoidal-wave pulse.

It is also preferred that the flow encoding pulse is a fourth-order flow encoding pulse having the four trapezoidal-wave pulses, and said pulse duration coefficient for the pulse interval defining the pulse spacing of the last trapezoidal-wave is the pulse duration coefficient $b_3$ as for the fourth trapezoidal-wave pulse.

For example, the flow encoding pulse is applied in a slice direction, a phase-encoding direction, or a read-out direction set as magnetic field application directions in the magnetic resonance imaging. Further, the pulse sequence is based on afield gradient (FE) technique or a spin echo (SE) technique.

Still preferably, the gradient pulse is a gradient moment nulling (GMN) pulse nulling phase terms other than the phase term $\emptyset_0(t)$ of stationary nuclear spins.

In the case of GMN, it is preferred that the gradient moment nulling pulse is a third-order gradient moment nulling pulse having the three trapezoidal-wave pulses, and said pulse duration coefficient for the pulse interval defining the pulse spacing of the last trapezoidal-wave is the pulse duration coefficient $b_2$ as for the third trapezoidal-wave pulse.

It is also preferred that the gradient moment nulling pulse is a fourth-order gradient moment nulling pulse having the four trapezoidal-wave pulses, and said pulse duration coefficient for the pulse interval defining the pulse spacing of the last trapezoidal-wave is the pulse duration coefficient $b_3$ as for the fourth trapezoidal-wave pulse.

As a preferred example, the gradient moment nulling pulse is applied in a slice direction, a phase-encoding direction, or a read-out direction set as magnetic field application directions in the magnetic resonance imaging. As another preferred example, the pulse sequence is based on a field gradient (FE) technique or a spin echo (SE) technique.

As another aspect of the invention, there is provided a system for magnetic resonance (MR) imaging in which an object is imaged using a pulse sequence including a gradient pulse, comprising: means for storing information of the pulse sequence; and means for performing a scan of the object using the pulse sequence stored in the storing means, wherein said gradient pulse of the pulse sequence is determined in a manner that, as said gradient pulse, three or more trapezoidal-wave pulses of which polarities are time-sequentially inverted are provided, an amplitude g, a pulse duration t, and a slope k or a rise time rate of its polarity-inverting side pulse in connection with the first trapezoidal-wave pulse being given as initial values, a plurality of pulse duration coefficients $b_1$, $b_2$, etc. which determine pulse spacings $b_1.t$, $b_2.t$, etc. of the plurality of trapezoidal-wave pulses being known, and magnetic field gradient strength coefficients $a_1$, a2, etc. which determine amplitude $a_1.g$, $a_2.g$, etc. of the second and subsequent trapezoidal-wave pulses being unknown; expressions concerning phase terms $\emptyset(t)$ of nuclear spins producing an MR signal S(t) are analytically solved so that the values of at least a phase term $\emptyset_0(t)$ of stationary nuclear spins, a phase term $\emptyset_1(t)$ of nuclear spins having a velocity moment, and a phase term $\emptyset_2(t)$ of nuclear spins having an acceleration moment among the phase terms $\emptyset(t)$ are controlled to be desired values or are null according to the purpose of use of said gradient pulse; and one of combinations of said plurality of pulse duration coefficients $b_1$, $b_2$, etc. satisfying the results of the analysis is selected, in which said coefficient for a pulse interval defining the pulse spacing of the last trapezoidal-wave pulse has the smallest value.

DESCRIPTION OF THE PREFERRED EMBODIMENT

To begin with, a method of analytically setting a GMN and flow-encoding gradient pulse will be described in the order of its basic concept, a quadruple gradient pulse, and an example of a solution. In this setting method, a flow-encoding gradient pulse (flow-encoding pulse) used for blood flow imaging will be taken for instance. A GMN gradient pulse used to produce a normal MRI image can also be set analytically in the same fashion, though the order of a moment of nuclear spins whose phase is controlled or compensated is different.

[1] Basic Concept

In general, assuming that t is time and r is a position vector of spins, an MR signal S(t) is expressed as the integral of a product of such terms as an equilibrium magnetization vector Mo(r), phase $\emptyset(t)$, and decay determined with a spin-spin relaxation time T2 relative to a volume. In the subsequent description, the time t defining a range of integration shall correspond to an echo time TE.

$$S(t) = \int_V M_0(\mathrm{r}) e^{-j\phi(t)} e^{-\frac{t}{T_2(\mathrm{r})}} d v \tag{1}$$

Furthermore, the phase $\emptyset(t)$ can be expressed as set forth below as the integral of an inner product of a magnetic field gradient G(t), which is a vector presented as a function of a gradient pulse relative to time, and the position vector r relative to time.

$$\phi(t) = \gamma \int_0^t G(t') \cdot r \, dt' \quad (2)$$

where γ denotes a gyromagnetic ratio. For simple analysis, components in an x direction alone will be taken into consideration. A phase $\emptyset_x(t)$ is expressed as follows:

$$\phi_x(t) = \gamma \int_0^t G(t')x(t')dt' \quad (3)$$

When x(t) is expanded into a Taylor series, $$x(t) = x(0) + x'(0)t + \frac{x''(0)}{2!}t^2 + \frac{x'''(0)}{3!}t^3 + \ldots \quad (4)$$

where x(0) denotes a location (0th-order moment), x'(0) denotes a velocity (first moment), x"(0) denotes an acceleration (second moment), and x'"(0) denotes a jerk (third moment). Consequently, the expression (3) can be rewritten as follows:

$$\phi_X(t) = \quad (5)$$

$$\gamma x(0) \int_0^t G(t')dt' + \gamma x'(0) \int_0^t t'G(t')dt' + \gamma \frac{x''(0)}{2!} \int_0^t t'^2 G(t')dt' +$$

$$\gamma \frac{x'''(0)}{3!} \int_0^t t'^3 G(t')dt \equiv \phi_0(t) + \phi_1(t) + \phi_2(t) + \phi_3(t) + \ldots$$

where $\emptyset_0(t)$, $\emptyset_1(t)$, $\emptyset_2(t)$, and $\emptyset_3(t)$ denote phases relevant to respective moments.

A flow-encoding pulse that is the basics of the phase method and devised by Moran et al. is a pulse representing a moving blood flow alone which is extracted from phase shift information of phase shifts of phases $\emptyset_1(t)$ and thereafter by nulling (compensating for) a phase shift of a phase $\emptyset_0(t)$ of stationary spins. The flow-encoding pulse is generally referred to as a bipolar gradient pulse (hereinafter BGP) (See FIG. 1A). This technique is exploited in various applications by Dumoulin et al.

What poses a problem in terms of quantitativeness of a blood flow velocity is that the quantitativeness is nullified. This is because in a region in which high-order moments providing acceleration of a blood flow and others cannot be ignored, such as, a region with vascular stenosis or vascular bifurcation, when the BGP is applied, phases $\emptyset_2(t)$ and $\emptyset_3(t)$ are added to a phase (relevant to a velocity) to be observed $\emptyset_1(t)$. Moreover, in the case of MR angiography (MRA), since it can be interpreted that the coherency of a phase $\emptyset_x(t)$ among spins is nullified, a so-called flow void phenomenon may ensue.

Figure 1A:
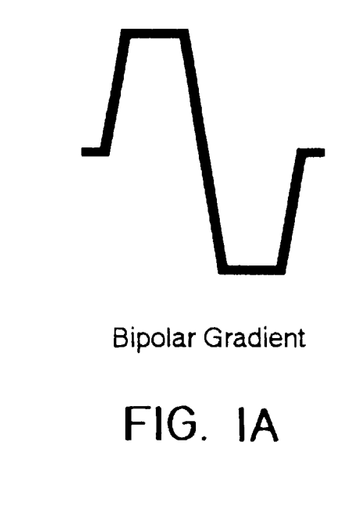
FIGS. 1A to 1C are diagrams of waveforms for explaining a bipolar gradient pulse, triple gradient pulse, and quadruple gradient pulse.
Figure 1B:
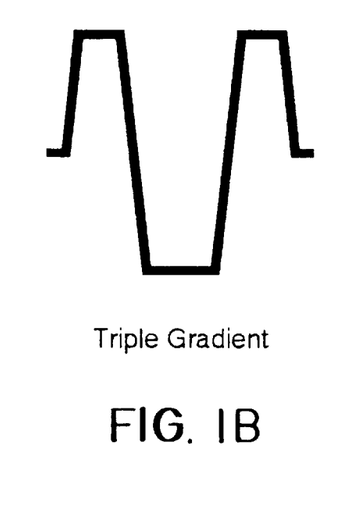
Figure 1C:
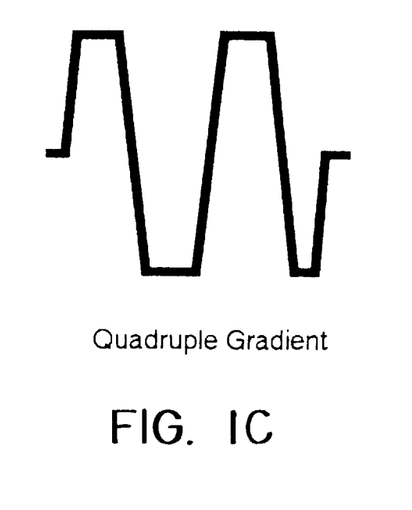

Consequently, it is necessary to use a triple or quadruple gradient pulse shown in FIG. 1B or 1C, respectively. When these pulses are studied in terms of controlling a phase of spins, the findings will be summarized as set forth below.

(1) In the case of a bipolar gradient pulse, the values of the phases $\emptyset_0(t)$ and $\emptyset_0(t)$ can be controlled but the phase $\emptyset 1(t)$ cannot be compensated.
(2) In the case of a triple gradient pulse, the values of the phases $\emptyset_0(t)$, $\emptyset_1(t)$, and $\emptyset_2(t)$ can be controlled but the phase $\emptyset_2(t)$ cannot be compensated.
(3) In the case of a quadruple gradient pulse, the values of the phases $\emptyset_0(t)$, $\emptyset_1(t)$, $\emptyset_3(t)$, and $\emptyset_3(t)$ can be controlled but the phase $\emptyset_3(t)$ cannot be compensated.

As readily apparent from FIGS. 1A to 1C, an echo time TE gets longer with a larger number of pulses constituting an applied pulse. According to expression (1), therefore, the strength of a signal $S_{(TE)}$ decreases and a signal-to-noise ratio deteriorates. In any case, the echo time TE is requested to be minimized within a range permitted by the electrical characteristics (the magnetic field gradient strength and rise time of a pulse) of a magnetic field gradient system. Next, a technique of setting and analyzing parameters for a quadruple trapezoidal-wave gradient pulse will be described.

[2] Quadruple Gradient Pulse

Figure 2:
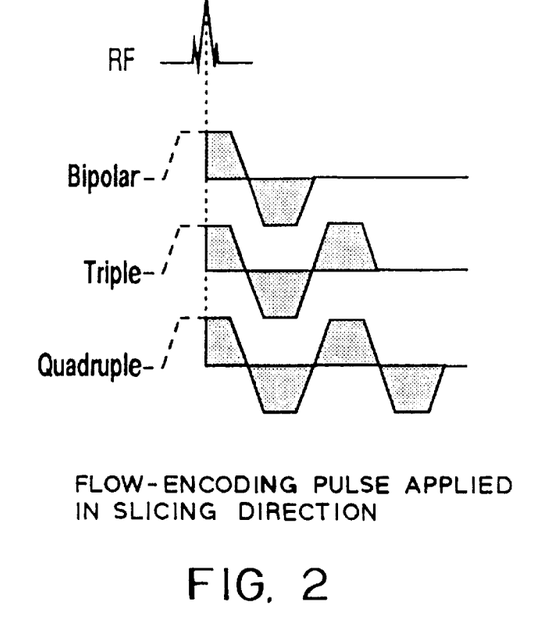
FIG. 2 is a diagram of waveforms of a bipolar flow-encoding pulse, triple flow-encoding pulse, and quadruple flow-encoding pulse which are applied in a slicing direction.
Figure 3:
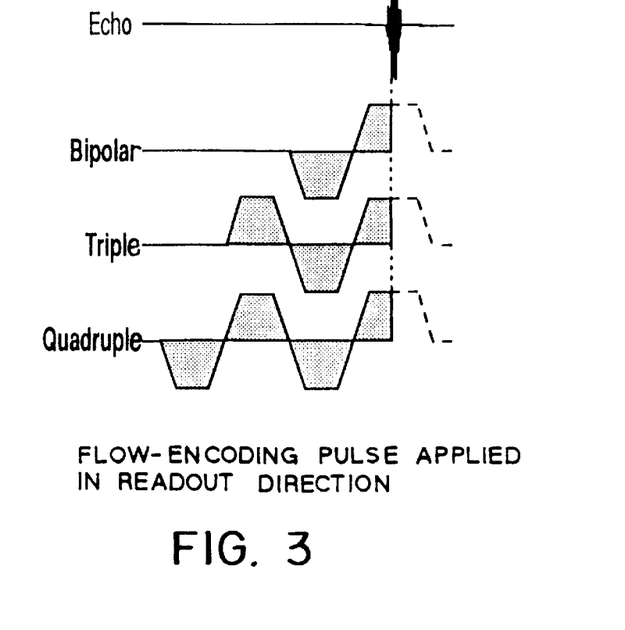
FIG. 3 is a diagram of waveforms of a bipolar flow-encoding pulse, triple flow-encoding pulse, and quadruple flow-encoding pulse which are applied in a readout direction.

FIGS. 2 and 3 show three kinds of flow-encoding pulses applied in a slicing magnetic field gradient direction and readout magnetic field gradient direction, respectively. Unlike FIGS. 1A to 1C, a rise time of an actual gradient pulse is finite due to the electrical characteristics of a magnetic field gradient system. The waveform of the gradient pulse is therefore, as illustrated, trapezoidal. Pulses or shaded parts in the drawings, that is, pulses succeeding a selective excitation pulse in FIG. 2 and pulses preceding an echo derived from a gradient pulse in FIG. 3 contribute to flow encoding. Thus, an echo time TE can be shortened by superposing the flow-encoding gradient pulse and the selective excitation pulse or readout gradient pulse. However, a phase shift occurs during the period of superposition. For actual pulse setting, the time instant indicated with a dashed line in each of the drawings is adjusted so that the phase shift will effectively be made null.

Since the bipolar and triple gradient pulses can be considered as special cases of the quadruple gradient pulse, the quadruple gradient pulse alone will be described below.

Figure 4:
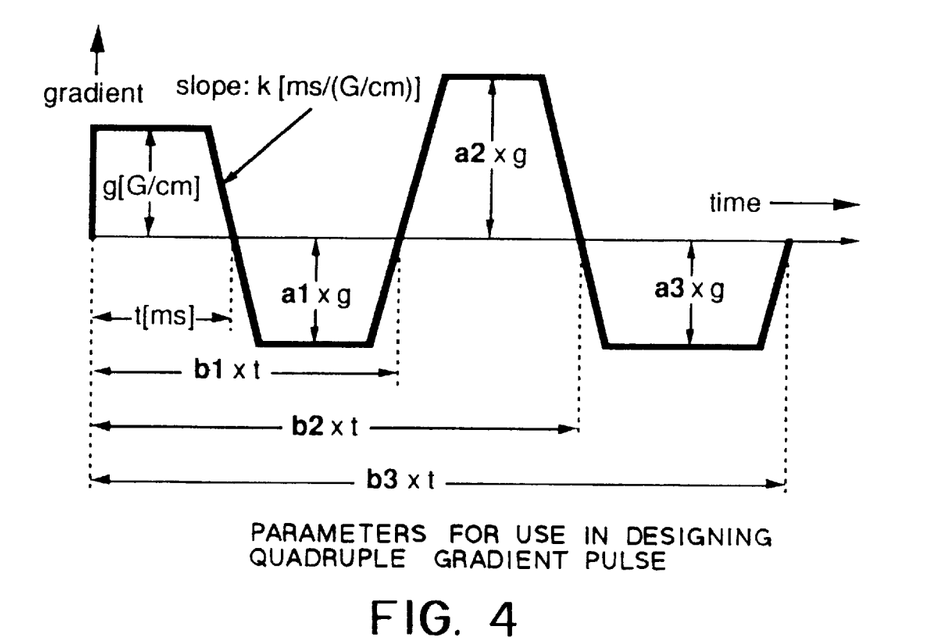
FIG. 4 is a diagram for explaining parameters defining an overall waveform to be employed in designing a quadruple gradient pulse.

FIG. 4 shows parameters employed in design (FIG. 4 is concerned with a pulse to be applied in a slicing direction. However, since a pulse to be applied in a readout direction is a pulse whose waveform is merely laterally reverse to the pulse, the analysis described below can be employed as it is). Conditions and design parameters to be given are as listed below (See FIG. 4).

| <Conditions> | |
|---|---|
| Magnetic field gradient strength of first pulse: | g [G/cm] |
| Pulse duration of first pulse: | t [ms] |
| Slope (or Rise time rate ) of pulses: | k [ms/(G/cm)] |
| <Design Parameters > | |
| Coefficients of magnetic field gradient strength of second, third, and fourth pulses relative to g | $(-a_1)$, $a_2$, $(-a_3)$ |
| Coefficients of pulse durations of second, third, and fourth pulses relative to t | $b_1$, $b_2$, $b_3$ |

For carrying out flow encoding, a phase $\emptyset_1$ relevant to a velocity moment alone must be controlled and phases relevant to other moments must be compensated. The first assignment to be dealt with for this purpose is such that the above parameters are used to calculate the integral of expression (5) and to thus work out phases $\emptyset_0$, $\emptyset_1$, and $\emptyset_2$ relative to moments of motional spins, and then simultaneous equations below are solved.

$$\left. \begin{array}{l} \phi_0(g, t, k: a_1, a_2, a_3, b_1, b_2, b_3) = 0 \\ \phi_1(g, t, k: a_1, a_2, a_3, b_1, b_2, b_3) = \text{Control value } P1 \\ \phi_2(g, t, k: a_1, a_2, a_3, b_1, b_2, b_3) = 0 \end{array} \right\} \quad (6)$$

The phase method is, principally, not concerned with amplitude information. However, since a signal-to-noise ratio of a signal becomes a bottleneck to improvement of precision in calculating a phase, an echo time TE must be minimized. As apparent from FIG. 4, the second assignment is therefore to find out the smallest value of the coefficient $b_3$ satisfying the above equations.

For dealing with the foregoing two assignments, conditions dependent on the electrical characteristics of gradient coils and an amplifier system and conditions dependent on setting for imaging are appended to the foregoing conditions. Next, an example of a solution will be described.

[3] Example of a Solution

Figure 5:
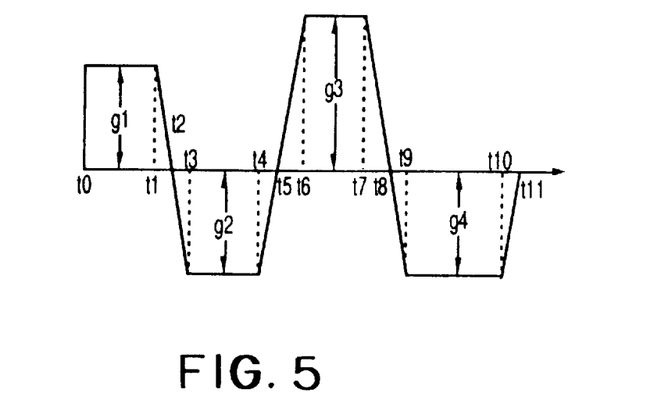
FIG. 5 is a diagram for explaining coefficients for magnetic field gradient strengths to be employed in designing a quadruple gradient pulse.
Figure 6A:
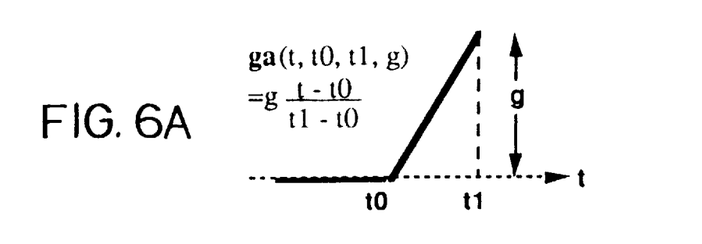
FIGS. 6A to 6C are diagrams for explaining basic functions to be employed in designing a gradient pulse.
Figure 6B:
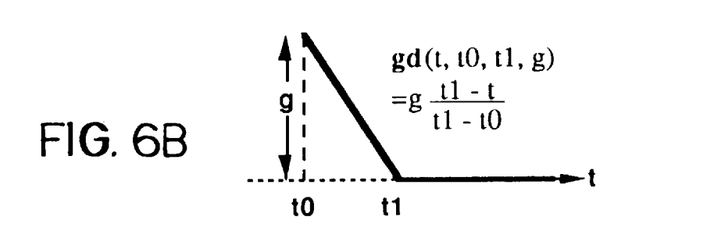
Figure 6C:
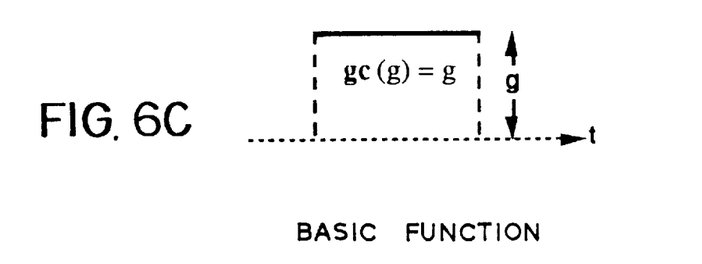

Parameters are defined as indicated in FIG. 5. The integral for calculating a phase is an integral of basic functions (FIGS. 6A to 6C) concerning a trapezoidal-wave gradient pulse.

$$g\_a(t, t0, t1, g) = g \frac{t - t0}{t1 - t0}, \tag{7}$$

$$g\_d(t, t0, t1, g) = g \frac{t1 - t}{t1 - t0}, \quad g\_c(g) = g$$

Using the above expressions (7), integral functions concerning the first trapezoidal-wave pulse and the second and subsequent trapezoidal-wave pulses are defined as part(t,p,t1,t2,t3,g) and trapint(t,p,t0,t1,t2,t3,g) as follows:

$$\text{part}(t, p, t1, t2, t3, g) = \int_{t1}^{t2} t^p \cdot gc(g)dt + \int_{t2}^{t3} t^p \cdot gd(t, t2, t3, g)dt \tag{8}$$

$$\text{trapint}(t, p, t0, t1, t2, t3, g) = \tag{9}$$

$$\int_{t0}^{t1} t^p \cdot ga(t, t0, t1, g)dt + \int_{t1}^{t2} t^p \cdot gc(g)dt + \int_{t2}^{t3} t^p \cdot gd(t, t2, t3, g)dt$$

Using these two functions, a phase $\emptyset_n$ (where n=0, 1, 2 (moment number)) is expressed as follows:

$$\begin{aligned}\phi_n = \text{part}(t, n, t0, t1, t2, g1) &+ \text{trapint}(t, n, t2, t3, t4, t5, g2) \\ &+ \text{trapint}(t, n, t5, t6, t7, t8, g3) \\ &+ \text{trapint}(t, n, t8, t9, t10, t11, g4)\end{aligned} \tag{10}$$

The provided initial condition t is replaced with "u×gk" as a multiple of a pulse rise time "gk". Consequently, the foregoing parameters are replaced as set forth below in consideration of FIGS. 4 and 5:

$$\left.\begin{aligned} g_1 &\to g \\ g_2 &\to -a_1 g \\ g_3 &\to a_2 g \\ g_4 &\to -a_3 g \end{aligned}\right\} \tag{11}$$

$$\left.\begin{aligned} t_0 &\to 0 \\ t_1 &\to ugk - gk \\ t_2 &\to ugk \\ t_3 &\to ugk + a_1 gk \\ t_4 &\to b_1 ugk - a_1 gk \\ t_5 &\to b_1 ugk \\ t_6 &\to b_1 ugk + a_2 gk \\ t_7 &\to b_2 ugk - a_2 gk \\ t_8 &\to b_2 ugk \\ t_9 &\to b_2 ugk + a_3 gk \\ t_{10} &\to b_3 ugk - a_3 gk \\ t_{11} &\to b_3 ugk \end{aligned}\right\} \tag{12}$$

As a result of the integration of expression (10) and the replacement of expression (12), phases $\emptyset_0$, $\emptyset_1$, and $\emptyset_2$ are expressed as follows:

$$\phi_0 = \tag{13}$$

$$\frac{1}{2} x(0)\gamma g^2 k [-2u\{a_3(b_3 - b_2) - a_2(b_2 - b_1) + a_1(b_1 - 1) - 1\} + $$

$$\{2a_3^2 - 2a_2^2 + 2a_1^2 - 1\}]$$

$$\phi_1 = \tag{14}$$

$$\frac{1}{6} x'(0)\gamma g^3 k^2 [3u^2\{a_3(b_3^2 - b_2^2) - a_2(b_2^2 - b_1^2) + a_1(b_1^2 - 1) - 1\} - $$

$$3u\{a_3^2(b_3 + b_2) - a_2^2(b_2 + b_1) + a_1^2(b_1 + 1) - 1\} + \{-1\}]$$

$$\phi_2 = \tag{15}$$

$$\frac{1}{24} x''(0)\gamma g^4 k^3 [-4u^3\{a_3(b_3^3 - b_2^3) - a_2(b_2^3 - b_1^3) + a_1(b_1^3 - 1) - 1\} + $$

$$6u^2\{a_3^2(b_3^2 + b_2^2) - a_2^2(b_2^2 + b_1^2) + a_1^2(b_1^2 - 1) - 1\} - $$

$$4u^2\{a_3^3(b_3 - b_2) - a_2^3(b_2 - b_1) + a_1^3(b_1 - 1) - 1\} + $$

$$\{2a_3^4 - 2a_2^4 + 2a_1^4 - 1\}]$$

For solving the simultaneous equations (6) by assigning the above expressions (13), (14), and (15), the coefficients for pulse durations $b_1$, $b_2$, and $b_3$ shall be considered to be known and the coefficients for magnetic field gradient intensities $a_1$, $a_2$, and $a_3$ shall be considered to be unknown. The solutions will be presented below.

$$a_1 = \frac{u}{2}(b_1 - 1) - \frac{1}{12}\sqrt{\{6u(b_1 - 1)\}^2 - \frac{24h_1}{u(1 - b_2)}} \tag{16}$$

where $$h_1 = 6u^2\{a_3(b_2 - b_3)(b_3 - b_1) + (1 - b_1 - b_2)\} - \tag{17}$$

$$3u\{(2 - b_1 - b_2) + 2a_3^2(b_1 - b_3)\} + 2(1 + p\ 1)$$

$$a_2 = \frac{u}{2}(b_2 - b_1) - \frac{1}{12}\sqrt{\{6u(b_2 - b_1)\}^2 - \frac{24h_2}{u(1 - b_2)}} \tag{18}$$

where

-continued
$$h_2 = 6u^2\{a_3(b_2 - b_3)(-1 - b_1 + b_2 + b_3) - b_1\} - \quad (19)$$

$$3u\{2a_3^2(1 + b_1 - b_2 - b_3) + (1 - b_1)\} + 2(1 + p1)$$

$$a_3 = \frac{1}{2} u(b_3 - b_2) - \frac{1}{96} \sqrt{c - 192\sqrt{d^2 - \frac{96e}{u(b_1 - b_3)}}} \quad (20)$$

where $$c = 2304\{2 - 4u + u^2(2 - 2b_2 + b_2^2 - 2b_3 + b_3^2)\} - \quad (21)$$

$$\frac{768}{u(b_1 - b_3)} \{3u(1 - b_3 + 2ub_3) - 2(1 + p1)\}$$

$$d = 24\{(2u - 1) + u^2(b_2 - 1)(1 - b_3)\} + \quad (22)$$

$$\frac{4}{b_1 - b_3} \left\{ 3(1 - b_3 + 2ub_3) - \frac{2 + p1}{u} \right\}$$

$$e = 24u^4 b_1 b_2 (b_2 - 1) - 12u^3\{b_2(1 - 2b_1 - b_2 + b_1 b_2) - b_1\} - \quad (23)$$

$$4u^2\{4b_1 + b_2(2b_2 + 2b_1 - 3) - 2 + 2 p1(b_1 b_2 + b_2^2 - 1 - b_1)\} +$$

$$u(6b_1 - 3b_2 - 8 p1 - 11) + 4(1 + p1)$$

The conditions for the parameters provided in the previous page are rewritten as set forth below in consideration of FIG. 5 and expression (12).

$$\left.\begin{array}{ll} b_1 \geq 1 & \\ b_2 \geq b_1 & \\ b_3 \geq b_2 & \\ a_n(n = 1, 2, 3) \geq 0 & \\ u \geq 1 & [t1 - t0 \geq 0] \\ u(b_1 - 1) \geq 2a_1 & [t4 - t3 \geq 0] \\ u(b_2 - b_1) \geq 2a_2 & [t7 - t6 \geq 0] \\ u(b_3 - b_2) \geq 2a_3 & [t10 - t9 \geq 0] \end{array}\right\} \quad (24)$$

Furthermore, the restriction below is appended because a magnetic field gradient system has some of parameters thereof limited to values inherent thereto.

Max <g, a₁g, a₂, a₃g> ≤ Maximum magnetic field gradient strength  (25)

k ( Rise time of magnetic field gradient pulse per unit magnetic field gradient strength) ≥ Minimun rise time  (26)

Max <(1+a₁)g, (a₁+a₂)g, (a₂+a₃)g> ≤ Maximum amplitude of magnetic field gradient relative to certain k value  (27)

where Max<<list>> means a maximum value in a list.

For actual calculation, $b_1$, $b_2$, and $b_3$ are replaced as set forth below in consideration of the conditions of expression (24).

$$\left.\begin{array}{l} b_1 = 1 + \Delta b_1 \\ b_2 = b_1 + \Delta b_2 \\ b_3 = b_2 + \Delta b_3 \end{array}\right\} \quad (28)$$

The $a_1$, $a_2$, and $a_3$ values satisfying the aforesaid conditions are calculated in relation to combinations of the values of the $\Delta b_1$, $\Delta b_2$, and $\Delta b_3$. Thereafter, a procedure is carried out for selecting one of the combinations which provides a minimum value for $\Delta b1 + \Delta b2 + \Delta b3$.

Since the triple and bipolar flow-encoding pulses are regarded as special cases of the quadruple flow-encoding pulse in which $a_3$ in FIG. 4 equals to 0, and $a_3$ and $a_2$ in FIG. 4 equal to 0 respectively, the foregoing technique can be adapted to the triple and bipolar flow-encoding pulses as it is.

Next, an embodiment of the present invention will be described with reference to the drawings.

Figure 7:
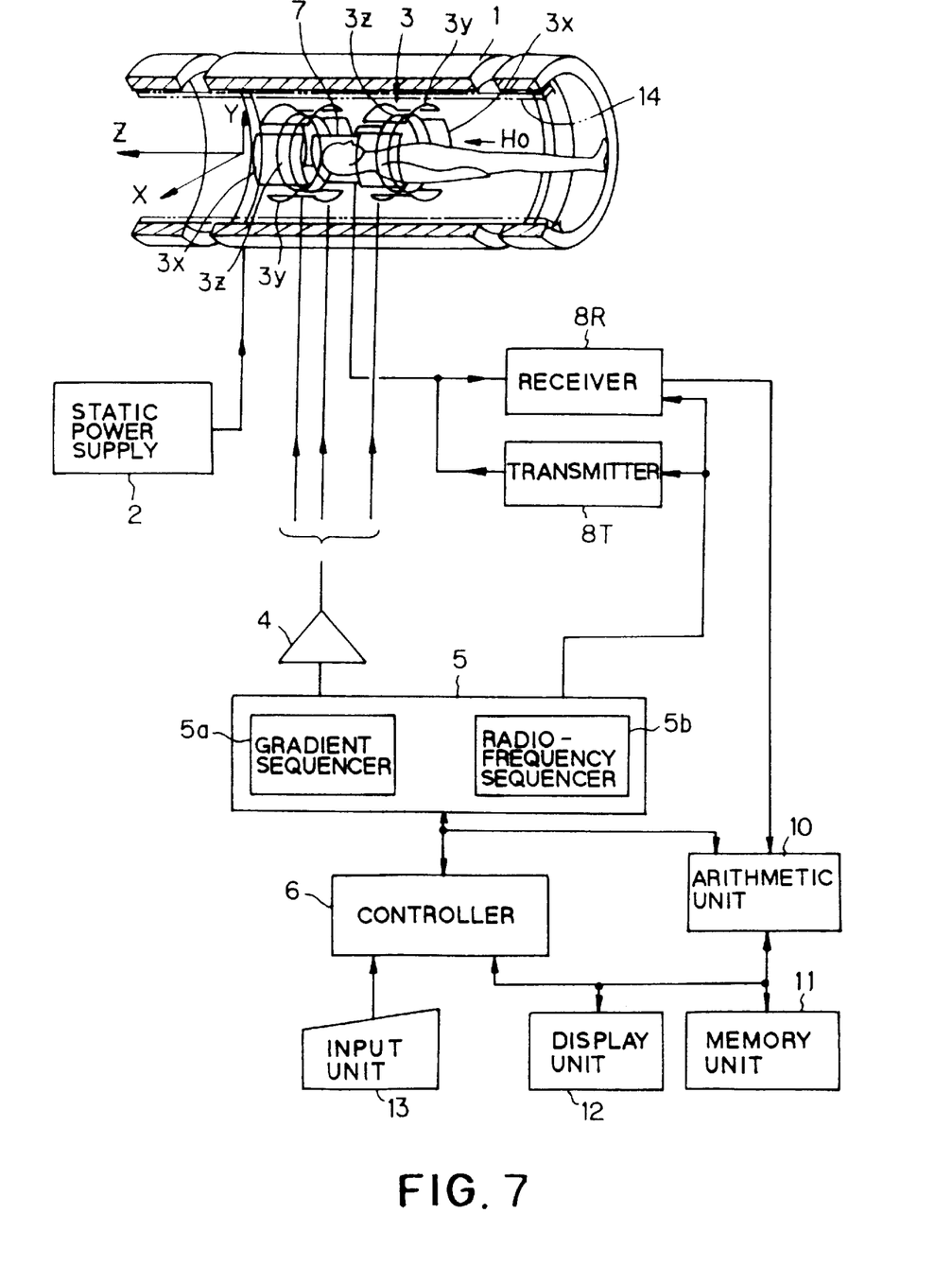
FIG. 7 is an overall block diagram of a magnetic resonance imaging system in which an imaging method of an embodiment of the present invention is implemented.

FIG. 7 schematically shows the configuration of a magnetic resonance imaging system in accordance with this embodiment. The magnetic resonance imaging system comprises a magnet unit for generating a static magnetic field, a magnetic field gradient unit for appending position information to the static magnetic field, a transmission/reception unit for receiving an MR signal, and a control arithmetic unit responsible for system control and image reconstruction.

The magnet unit includes a magnet 1 of, for example, a superconducting type, and a static power supply 2 for supplying a current to the magnet 1, and generates a static magnetic field $H_0$ in a Z-axis direction of a cylindrical bore into which a patient P is inserted. The magnet unit has shim coils 14 used for primary shimming. Shimming is achieved by adjusting a current to be supplied to the shim coils 14.

The magnetic field gradient unit includes three sets of gradient coils 3x to 3z associated with X-axis, Y-axis, and Z-axis directions respectively and incorporated in the magnet 1, a gradient power supply 4 for supplying a current to the gradient coils 3x to 3z, and a gradient sequencer 5a included in a sequencer 5 for controlling the power supply 4. The gradient sequencer 5a includes a computer, and receives a signal for commanding an acquisition pulse sequence, which is employed in FE imaging or SE imaging in which GMN or flow encoding is implemented, from a controller 6 for handling the whole system. According to the commanded pulse sequence, the gradient sequencer 5a applies magnetic field gradients changing in strength in the X-axis, Y-axis, and Z-axis directions respectively and controls the magnetic field strengths. Thus, the magnetic field gradients are superposed on the static magnetic field $H_0$. In this embodiment, the magnetic field gradient changing in the Z-axis direction among the three axial directions that are mutually orthogonal is regarded as a slicing magnetic field gradient $G_S$, the one changing in the X-axis direction is regarded as a readout magnetic field gradient $G_R$, and the one changing in the Y-axis direction is regarded as a phase-encoding magnetic field gradient $G_E$.

The transmission/reception unit includes a radio-frequency coil 7 placed in the vicinity of the patient P in an imaging space within the magnet 1, a transmitter 8T and receiver 8R connected to the coil 7, and a radio-frequency (RF) sequencer 5b included in the sequencer 5 for controlling the operations of the transmitter 8T and receiver 8R (including a computer). The transmitter 8T and receiver 8R supply pre-pulses used for excitation resulting in nuclear magnetic resonance or radio-frequency current pulses of the Larmor frequency to the radio-frequency coil 7. Moreover, the transmitter 8T and receiver 8R receive an MR (radio-frequency) signal received by the radio-frequency coil 7, perform various kinds of signal processing on the MR signal, and thus produce a corresponding digital signal.

Furthermore, the control arithmetic unit includes not only the controller 6 but also an arithmetic unit 10 for inputting digital data of an MR signal produced by the receiver 8R and computes image data, a memory unit 11 for storing the computed image data, a display unit 12 for displaying an image, and an input unit 13. The arithmetic unit 10 engages, in practice, in mapping of measured data to a Fourier space that is a memory space, Fourier transform for image reconstruction, or the like. The controller 6 controls the contents of the operations of the gradient sequencer 5a and radio-frequency sequence 5b and the operating timing thereof while synchronizing both the sequencers.

Figure 8:
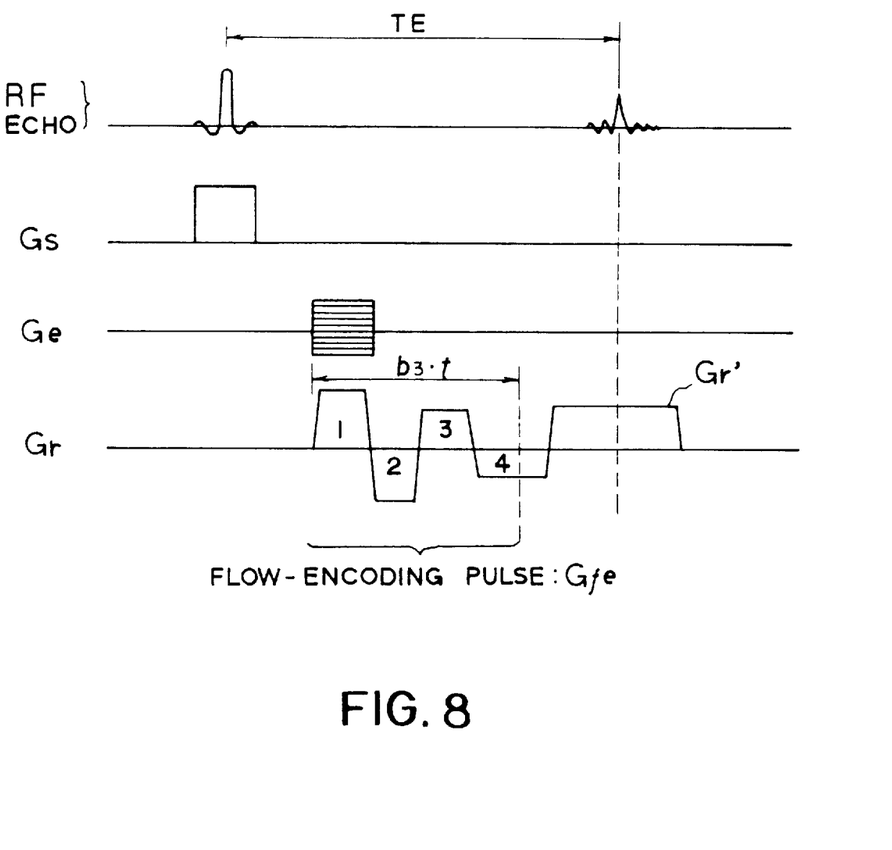
FIG. 8 is a diagram of waveforms indicating an example of a pulse sequence in accordance with the embodiment.
Figure 9:
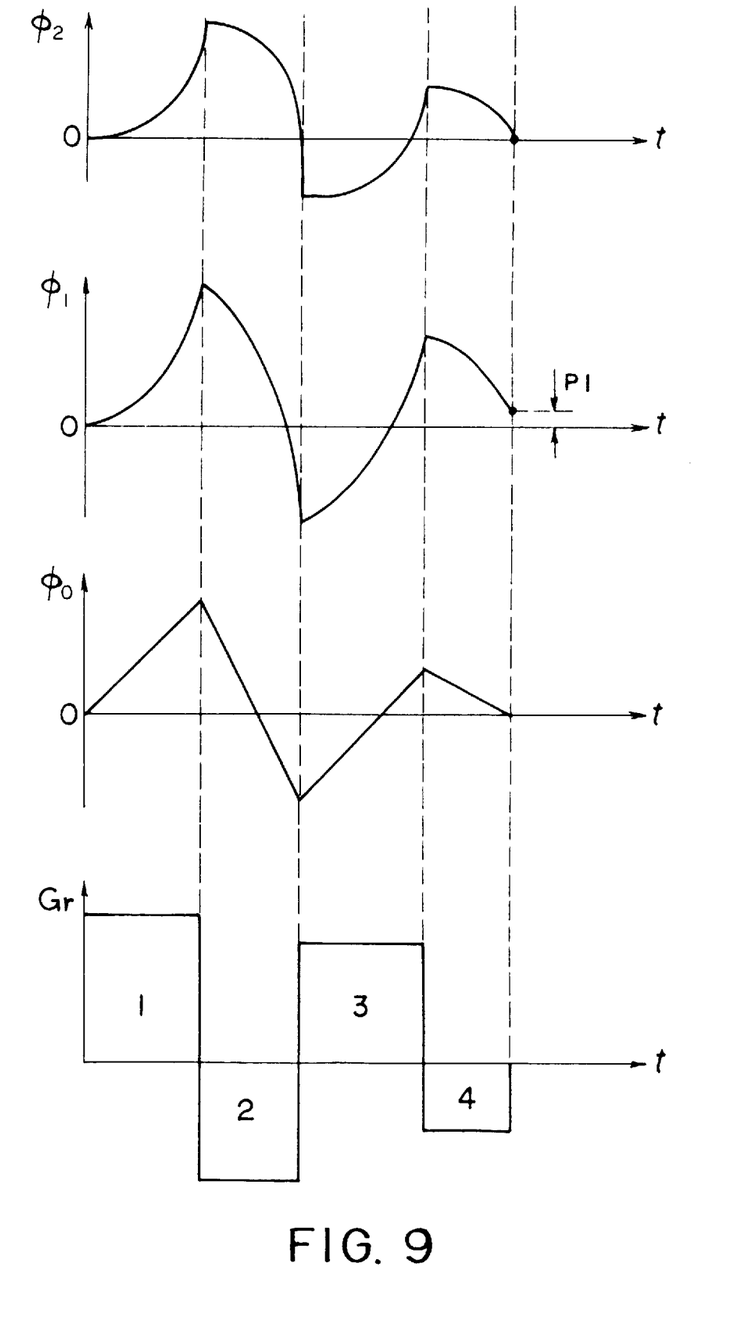
FIG. 9 is a diagram of phases indicating phase shifts relevant to moments of different orders.

FIG. 8 shows a pulse sequence (for FE imaging) in which a quadruple flow-encoding pulse commanded by the sequencer 5 is used as the readout gradient pulse Gr, and FIG. 9 is a diagram of phases. As shown in FIG. 8, after a slicing gradient pulse Gs is applied to a patient together with a radio-frequency (RF) signal, a phase-encoding gradient pulse Ge is applied. With the application of the phase-encoding gradient pulse Ge, application of a readout gradient pulse Gr is started.

The readout gradient pulse Gr contains a quadruple flow-encoding pulse $G_{fe}$ as a leading part thereof. The flow-encoding pulse $G_{fe}$ is composed of four trapezoidal-wave pulses 1 to 4 the first one of which rises in a direction of a positive polarity and the remaining ones of which assume negative, positive, and negative polarities. The flow-encoding pulse thus reverses in polarity three times. According to the aforesaid pulse setting method, the magnetic field gradient strengths of the four trapezoidal-wave pulses 1 to 4 and the ratio of the areas defined with the waveforms thereof are determined so that phases relevant to the 0th-order moment of (stationary) nuclear spins and to the second moment (acceleration) thereof can be compensated (made null), that a phase relevant to the first moment (velocity) thereof can be used to encode a blood flow, and that the coefficient b3 for a pulse duration determining a pulse duration "b3×t" of the whole of the four trapezoidal-wave pulses 1 to 4 can be minimized.

Nuclear spins constituting a blood flow in a patient are encoded successively as shown in the diagram of FIG. 9 of phases by applying the four trapezoidal-wave pulses 1 to 4. After the application of the fourth trapezoidal-wave pulse 4, the phase $\emptyset_1$ relevant to the first (velocity) moment assumes a control value P1 dependent on the flow, and the phases $\emptyset_0$ and $\emptyset_2$ relevant to the other moments are made null. Eventually, the blood flow can be subjected to flow encoding according to the velocity of the blood flow.

After the completion of flow encoding using the flow-encoding pulse $G_{fe}$, a readout pulse Gr' is applied. In the middle of the pulse width of the pulse Gr', a phased echo employed in FE imaging has a peak value and is then acquired. The echo is sent as a signal of a digital quantity to the arithmetic unit 10 via the radio-frequency coil 7 and receiver 8R, whereby an image is reconstructed according to Fourier transform.

Even for a blood flow which passes through a vessel partly bifurcated or stenosed and in which the kinetic components of nuclear spins represented by the second and subsequent moments thereof cannot be ignored, a phase relative to the second moment thereof that is a high-order moment can be compensated. Moreover, a quadruple flow-encoding pulse terminates shortly. An echo time TE itself therefore becomes the shortest under the provided conditions for scanning. The amplitude of an echo to be acquired does not get so smaller than that attained when a phase relevant to the first moment alone is compensated, but can be retained at a large value. As a result, artifacts deriving from velocity components can be reduced, while a signal-to-noise ratio is upgraded and the precision in computing a phase improves. Consequently, the precision and reliability in measuring a blood flow velocity can be improved.

According to the evaluation made by the present inventor, when a flow-encoding pulse (gradient pulse) is optimized analytically as mentioned above, an echo time TE becomes about a half of that attained when the optimization is not carried out.

Figure 10:
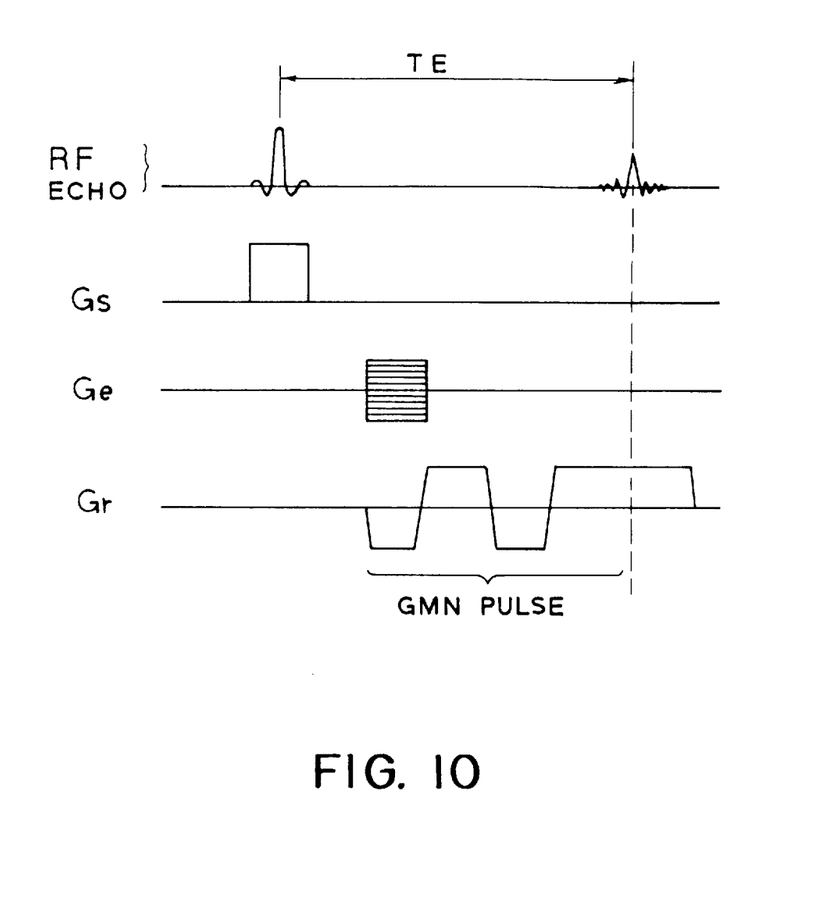
FIG. 10 is a diagram of waveforms indicating another example of a pulse sequence.

FIG. 10 shows an example of a pulse sequence in which a gradient pulse according to the present invention is applied as a quadruple gradient moment nulling (GMN) pulse in a readout direction. When the aforesaid analytic setting method is adapted to the GMN pulse, phases relevant to the first and subsequent moments of spins other than stationary spins can be compensated, while an echo time TE can be minimized. Consequently, artifacts on an image can be reduced. Moreover, a signal-to-noise ratio can be improved and image quality can thus be improved.

Figure 11:
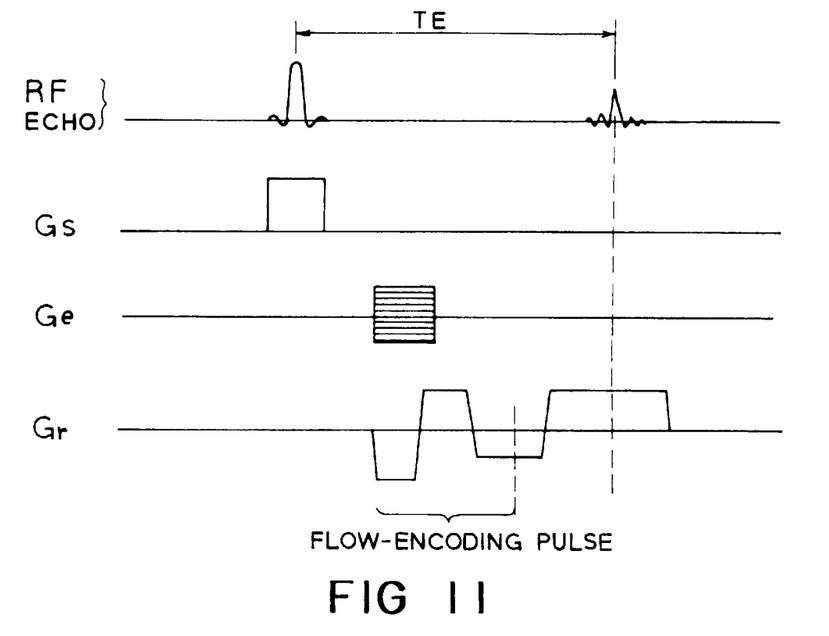
FIG. 11 is a diagram of waveforms indicating yet another example of a pulse sequence.
Figure 12:
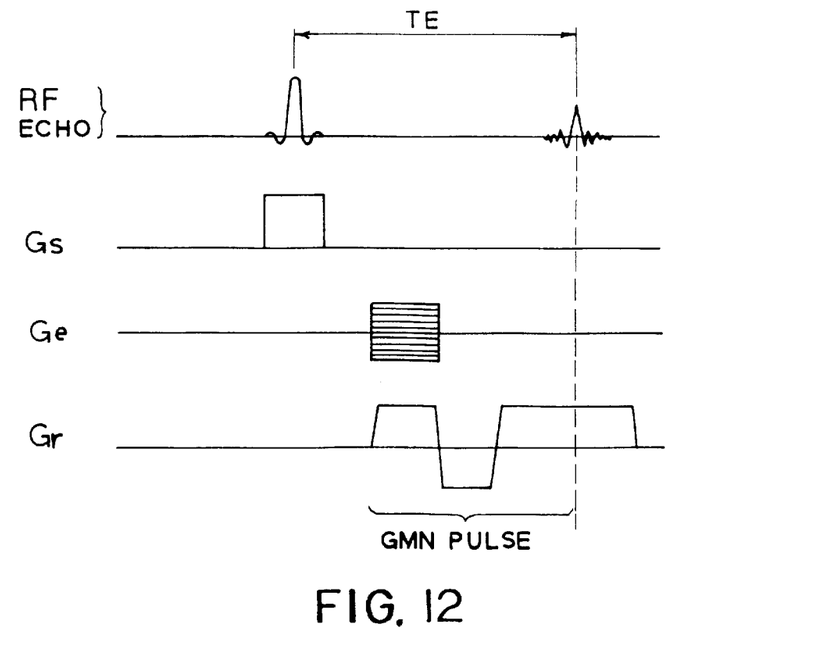
FIG. 12 is a diagram of waveforms indicating still another example of a pulse sequence.

FIG. 11 shows a pulse sequence (for FE imaging), in which a triple flow-encoding pulse is applied in a readout direction, as another embodiment of the present invention. FIG. 12 shows a pulse sequence (for GE imaging) in which a triple GMN pulse is applied in the readout direction. When these triple flow-encoding pulse and triple GMN pulse are set analytically according to the aforesaid method, not only the ability of the pulses to control and compensate a phase can be exerted but also an echo time TE can be minimized. The aforesaid effect resulting from improvement of a signal-to-noise ratio can be exerted. Besides, a scan time can be reduced.

The GMN pulse and flow-encoding pulse for use in controlling and compensating a phase in accordance with the present invention can be adapted not only to a magnetic field changing in strength in a readout direction but also to a magnetic field gradient changing in a slicing direction or phase-encoding direction.

In the aforesaid embodiments, the slope k of pulses is constant. Alternatively, even when the rise time (instead of the foregoing slope) of pulses is constant, the same applies.

A magnetic resonance imaging method to which a pulse sequence according to the present invention can be adapted is not limited to FE imaging but may be SE imaging.

The aforesaid analytic setting of a gradient pulse may be carried out using a computer installed separately from an MRI system or a controller in the MRI system.

For the sake of completeness it should be mentioned that the present invention is not limited to the above embodiments. The expert will appreciate that it is possible to supplement or modify the embodiments by measures known from the prior art without departing from the basic inventive principle.

What is claimed is:

1. A method of magnetic resonance imaging by which an object is scanned using a pulse sequence including a gradient pulse for controlling moments of nuclear spins in motion in the object, comprising the steps of:

analytically preparing the pulse sequence in advance; and
performing a scan on the object using the pulse sequence,
wherein the analytical preparing step further includes the steps of:
providing, as said gradient pulse, a pulse train having three or more trapezoidal-wave pulses of which polarities are alternately inverted,
wherein both an amplitude and a pulse duration of a first trapezoidal-wave pulse residing first in the pulse train and a rise time rate of each of the three or more trapezoidal-wave pulses are given as initial values, a plurality of pulse duration coefficients which determine pulse spacings of trapezoidal-wave pulses other than the first trapezoidal-wave pulse in the pulse train are given as known values, and magnetic field gradient strength coefficients which determine amplitudes of the of the trapezoidal-wave pulses other than the first trapezoidal-wave pulse in the pulse train are given as unknown values;

solving for the unknown magnetic field gradient strength coefficients from expressions concerning a plurality of different dimensions of moments of phase shifts caused by the nuclear spins producing a magnetic resonance signal so that the plurality of different dimensions of the moments of phase shifts are moment by moment at least one of 1) controlled to desired values other than zero and 2) compensated to null values according to a purpose of use of said gradient pulse, the expressions being reflected by both the initial values and the magnetic field gradient strength coefficients; and selecting one combination from a plurality of combinations of pulse duration coefficients satisfying results performed in the solving step, the one combination determining a shortest pulse train interval.

2. The method of claim 1, wherein said gradient pulse is a flow encoding pulse nulling a moment other than a first order moment of the nuclear spins.

3. The method of claim 2, wherein the plurality of different dimensions of moment of phase shift includes at least a zeroth order moment of the nuclear spins, the first order moment of the nuclear spins, and a second order moment of the nuclear spins.

4. The method of claim 3, wherein said flow encoding pulse is a third-order flow encoding pulse having three trapezoidal-wave pulses, and said combinations of the pulse duration coefficients include coefficients defining pulse duration spacings of a second and third trapezoidal-wave pulse residing in the pulse train.

5. The method of claim 2, wherein the plurality of different dimensions of moment of phase shift includes a zeroth order moment of the nuclear spins, the first order moment of the nuclear spins, a second order moment of the nuclear spins, and a third order moment of the nuclear spins.

6. The method of claim 5, wherein said flow encoding pulse is a fourth-order flow encoding pulse having four trapezoidal-wave pulses, and said combinations of the pulse duration coefficients include coefficients defining pulse duration spacings of a second, third and fourth trapezoidal-wave pulse residing in the pulse train.

7. The method of claim 2, wherein said flow encoding pulse is applied in at least one of a slice direction, a phase-encoding direction, and a read-out direction set as magnetic field application directions in the magnetic resonance imaging.

8. The method of claim 2, wherein said pulse sequence is based on one of a field gradient technique or a spin echo technique, said field gradient technique and said spin echo technique being used to acquire said magnetic resonance signal.

9. The method of claim 1, wherein said gradient pulse is a gradient moment nulling pulse nulling a moment other than a zeroth order moment of the nuclear spins.

10. The method of claim 9, wherein the plurality of different dimensions of moment of phase shift includes at least the zeroth order moment of the nuclear spins, a first moment of the nuclear spins, and a second order moment of the nuclear spins.

11. The method of claim 10, wherein said gradient moment nulling pulse is a third-order gradient moment nulling pulse having three trapezoidal-wave pulses, and said combinations of the pulse duration coefficients include coefficients defining pulse duration spacings of a second and third trapezoidal-wave pulse residing in the pulse train.

12. The method of claim 9, wherein the plurality of different dimensions of moment of phase shift includes the zeroth order moment of the nuclear spins, a first order moment of the nuclear spins, a second order moment of the nuclear spins, and a third order moment of the nuclear spins.

13. The method of claim 12, wherein said gradient moment nulling pulse is a fourth-order gradient moment nulling pulse having four trapezoidal-wave pulses, and said combinations of the pulse duration coefficients include coefficients defining pulse duration spacings of a second, third and fourth trapezoidal-wave pulse residing in the pulse train.

14. The method of claim 9, wherein said gradient moment nulling pulse is applied in at least one of a slice direction, a phase-encoding direction, and a read-out direction set as magnetic field application directions in the magnetic resonance imaging.

15. The method of claim 9, wherein said pulse sequence is based on one of a field gradient technique or a spin echo technique, said field gradient technique and said spin echo technique being used to acquire said magnetic resonance signal.

16. The method of claim 1, wherein said solving step includes obtaining a plurality of phase shift terms individually corresponding to the plurality of different dimensions of moments of phase shifts by performing a time integral between the gradient pulse and a position vector of the nuclear spins using the initial values and the magnetic field gradient strength coefficients, the time integral being included in the expressions, and solving a simultaneous equation composed of the plurality of phase shift terms, the simultaneous equation being included in the expressions.

17. The method of claim 16, wherein in the solving step and selecting step, both the solution and selection are performed in consideration of gradient-relating limitations inherent to a gradient system generating the gradient pulse.

18. A system for magnetic resonance imaging in which an object is scanned using a pulse sequence including a gradient pulse for controlling moments of nuclear spins in motion in the object, comprising:

means for setting the pulse sequence by analytical calculation as said gradient pulse, to include a pulse train having more than two trapezoidal-wave pulses of which polarities are alternately inverted, wherein both an amplitude and a pulse duration of a first trapezoidal-wave pulse residing first in the pulse train and a rise time rate of each of the more than two trapezoidal-wave pulses are given as initial values, a plurality of pulse duration coefficients which determine pulse spacings of trapezoidal-wave pulses other than the first trapezoidal-wave pulse in the pulse train are given as known values, and magnetic field gradient strength coefficients which determine amplitudes of the trapezoidal-wave pulses other than the first trapezoidal-wave pulse in the pulse train are given as unknown values, wherein expressions concerning a plurality of different dimensions of moments of phase shifts caused by nuclear spins producing a magnetic resonance signal are solved for the unknown magnetic field gradient strength coefficients so that the plurality of different dimensions of the moments of phase shift are moment by moment at least one of 1) controlled to desired values other than zero and 2) compensated to null values according to a purpose of use of said gradient pulse, the expressions being reflected by both the initial values and the magnetic field gradient strength coefficients, and wherein one combination is selected from a plurality of combinations of pulse duration coefficients satisfying a solution of said expressions concerning said plurality of different dimensions of moments of phase shifts, the one combination determining a shortest pulse train interval;

means for performing a scan on the object to acquire the magnetic resonance signal using the pulse sequence set by said means for setting; and means for producing a magnetic resonance image from the acquired magnetic resonance signal.

19. The system of claim 18, wherein said gradient pulse is a flow encoding pulse nulling a moment other than a first order moment of the nuclear spins.

20. The system of claim 18, wherein said gradient pulse is a gradient moment nulling pulse nulling a moment other than a zeroth order moment of the nuclear spins.

* * * * *

UNITED STATES PATENT AND TRADEMARK OFFICE
CERTIFICATE OF CORRECTION

PATENT NO. : 5,853,365

DATED : December 29, 1998

INVENTOR(S) : Yamagata

It is certified that error appears in the above-identified patent and that said Letters Patent is hereby corrected as shown below:

Column 2, line 16, delete "that",

Column 2, line 22, "in" (first occurrence) insert --an--.

Column 2, line 39, Change "comprising" to --comprises--.

Column 2, line 58, after "of" (first occurrence) insert --the--.

Column 3, line 65, after "of" (third occurrence) insert --the--.

Column 5, line 61, change "$\phi1(t)$" to --$\phi_1(t)$--.

Column 10, line 23, after "directions" insert --,--.

Column 10, line 23, after "respectively" insert --,--.

Column 10, line 34, after "directions" insert --,--.

Column 10, line 34, after "respectively" insert --,--.

UNITED STATES PATENT AND TRADEMARK OFFICE
CERTIFICATE OF CORRECTION

PATENT NO. : 5,853,365

DATED : December 29, 1998

INVENTOR(S) : Yamagata

It is certified that error appears in the above-identified patent and that said Letters Patent is hereby corrected as shown below:

Column 11, line 15, after "4" insert --,--.

Column 11, line 45, after "to" insert --a--.

Column 12, line 20, after "from" insert --an--.

Column 12, line 34, after "imaging" (first occurrence) insert --,--.

Signed and Sealed this

Eighth Day of June, 1999

Attest:

Q. TODD DICKINSON

*Attesting Officer*  *Acting Commissioner of Patents and Trademarks*